(12) United States Patent
Yamamoto et al.

(10) Patent No.: US 12,149,228 B2
(45) Date of Patent: Nov. 19, 2024

(54) ACOUSTIC WAVE DEVICE, WAFER, AND METHOD OF MANUFACTURING WAFER

(71) Applicant: TAIYO YUDEN CO., LTD., Tokyo (JP)

(72) Inventors: Shinji Yamamoto, Tokyo (JP); Koichi Sato, Tokyo (JP); Toshiharu Nakazato, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 253 days.

(21) Appl. No.: 17/991,259

(22) Filed: Nov. 21, 2022

(65) Prior Publication Data

US 2023/0208395 A1 Jun. 29, 2023

(30) Foreign Application Priority Data

Dec. 27, 2021 (JP) .................. 2021-212072

(51) Int. Cl.
| | |
|---|---|
| *H03H 9/25* | (2006.01) |
| *H03H 9/02* | (2006.01) |
| *H03H 9/145* | (2006.01) |
| *H03H 9/64* | (2006.01) |
| *H03H 9/72* | (2006.01) |
| *H10N 30/073* | (2023.01) |

(52) U.S. Cl.
CPC .......... *H03H 9/25* (2013.01); *H03H 9/02559* (2013.01); *H03H 9/14541* (2013.01); *H03H 9/6483* (2013.01); *H03H 9/725* (2013.01); *H10N 30/073* (2023.02)

(58) Field of Classification Search
CPC .. H03H 9/25; H03H 9/02559; H03H 9/14541; H03H 9/6483; H03H 9/725
USPC .................................................. 333/186–196
See application file for complete search history.

(56) References Cited

U.S. PATENT DOCUMENTS

| | | |
|---|---|---|
| 2019/0288661 A1 | 9/2019 | Akiyama et al. |
| 2020/0389148 A1 | 12/2020 | Vo et al. |

FOREIGN PATENT DOCUMENTS

| | | |
|---|---|---|
| JP | 2018-61258 A | 4/2018 |
| JP | 2020-510354 A | 4/2020 |

*Primary Examiner* — Rakesh B Patel
(74) *Attorney, Agent, or Firm* — Stein IP, LLC

(57) ABSTRACT

An acoustic wave device includes a support substrate, a piezoelectric layer provided on the support substrate, at least a pair of comb-shaped electrodes provided on the piezoelectric layer, each of the comb-shaped electrodes including a plurality of electrode fingers, and an insulating layer provided between the support substrate and the piezoelectric layer, the insulating layer having, in at least a part thereof, a plurality of void regions of which extending directions are different from each other when viewed from a thickness direction of the support substrate, a width in the corresponding extending direction of each of the void regions being longer than a width in a direction orthogonal to the corresponding extending direction when viewed from the thickness direction of the support substrate.

13 Claims, 16 Drawing Sheets

ACOUSTIC WAVE DEVICE, WAFER, AND METHOD OF MANUFACTURING WAFER

CROSS-REFERENCE TO RELATED APPLICATION

This application is based upon and claims the benefit of priority of the prior Japanese Patent Application No. 2021-212072, filed on Dec. 27, 2021, the entire contents of which are incorporated herein by reference.

FIELD

A certain aspect of the present embodiments relates to an acoustic wave device, a wafer, and a method of manufacturing the wafer.

BACKGROUND

Acoustic wave elements such as surface acoustic wave resonators are used in communication devices such as smartphones. It is known to bond a piezoelectric layer forming an acoustic wave element to a support substrate. It is known to roughen the upper surface of the support substrate as disclosed in, for example, Japanese Patent Application Laid-Open No. 2018-61258 (Patent Document 1). It is known to provide a layer having voids between the support substrate and the piezoelectric layer as disclosed in, for example, Japanese Patent Laid-Open No. 2020-510354 (Patent Document 2).

SUMMARY

By roughening the upper surface of the support substrate, spurious emissions can be reduced. The spurious emission can also be reduced by providing a layer having voids between the support substrate and the piezoelectric layer. However, there is room for improvement in terms of reducing spurious emissions while suppressing the deterioration of the main response.

An object of the present disclosure is to reduce spurious emissions.

In one aspect of the present disclosure, there is provided an acoustic wave device including: a support substrate; a piezoelectric layer provided on the support substrate, at least a pair of comb-shaped electrodes provided on the piezoelectric layer, each of the comb-shaped electrodes including a plurality of electrode fingers; and an insulating layer provided between the support substrate and the piezoelectric layer, the insulating layer having, in at least a part thereof, a plurality of void regions of which extending directions are different from each other when viewed from a thickness direction of the support substrate, a width in the corresponding extending direction of each of the void regions being longer than a width in a direction orthogonal to the corresponding extending direction when viewed from the thickness direction of the support substrate.

In another aspect of the present disclosure, there is provided a wafer including: a support substrate; a piezoelectric layer provided on the support substrate; an insulating layer provided between the support substrate and the piezoelectric layer, the insulating layer having, in at least a part thereof, a plurality of void regions of which extending directions are different from each other when viewed from a thickness direction of the support substrate, a width in the corresponding extending direction of each of the plurality of void regions being longer than a width in a direction orthogonal to the corresponding extending direction when viewed from the thickness direction of the support substrate.

In another aspect of the present disclosure, there is provided a method of manufacturing a wafer, the method including: forming, on a support substrate having an uneven surface, an insulating layer having a plurality of first void regions that are in contact with a recess portion of the uneven surface; forming a plurality of second void regions in the insulating layer by etching parts in contact with the plurality of first void regions of the insulating layer, extending directions of the plurality of second void regions being different from each other when viewed from a thickness direction of the support substrate, a width in the corresponding extending direction of each of the plurality of second void regions being longer than a width in a direction orthogonal to the corresponding extending direction when viewed from the thickness direction of the support substrate; and forming a piezoelectric layer on the insulating layer.

DETAILED DESCRIPTION

Hereinafter, embodiments of the present disclosure will be described with reference to the accompanying drawings.

First Embodiment

Figure 1A:
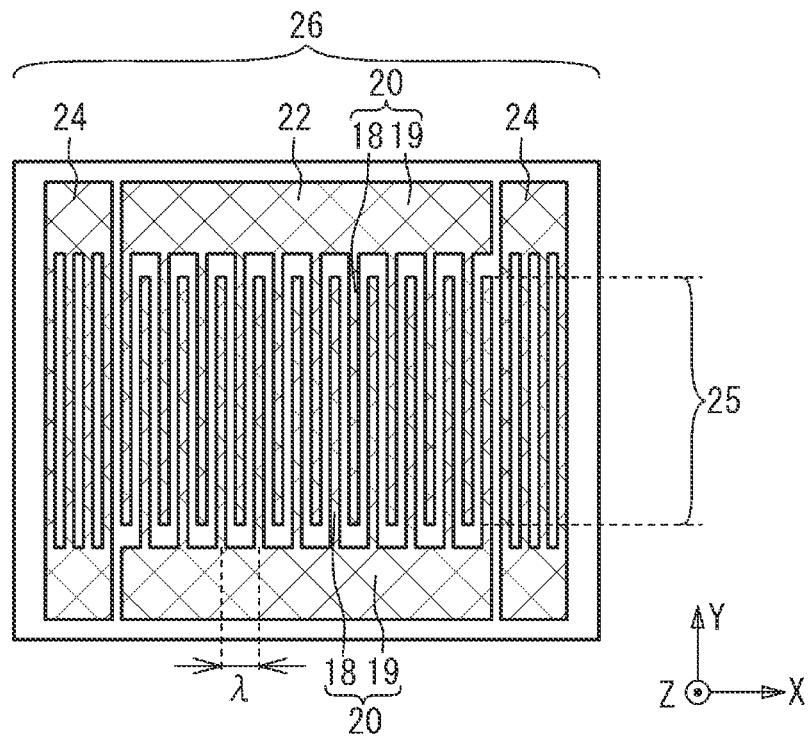
FIG. 1A is a plan view of an acoustic wave device in accordance with a first embodiment.
Figure 1B:
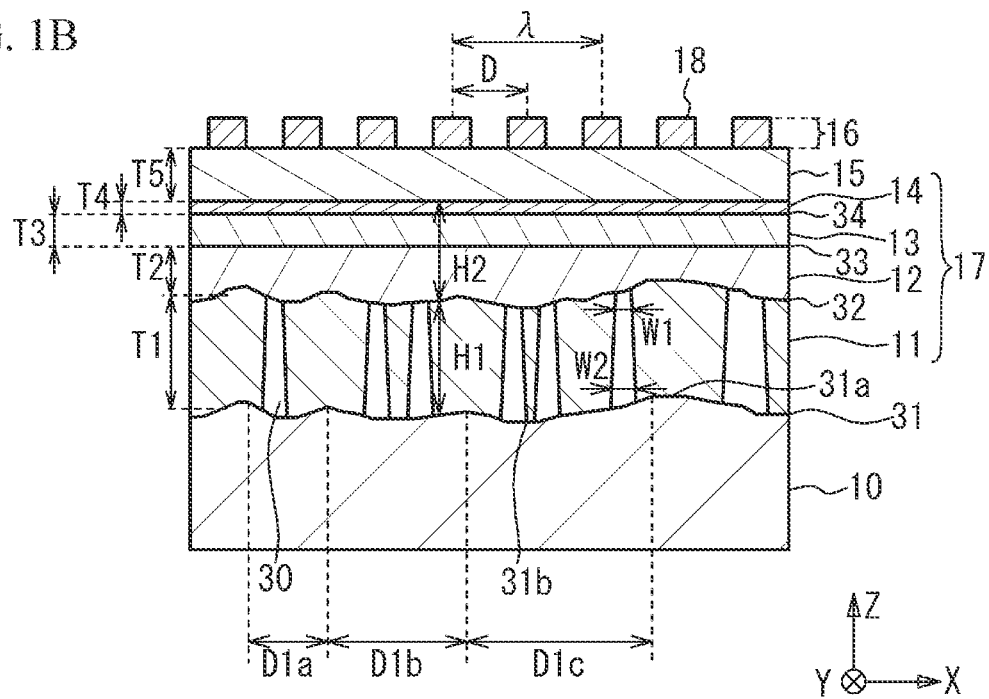
FIG. 1B is a cross-sectional view of the acoustic wave device in accordance with the first embodiment.

FIG. 1A is a plan view of an acoustic wave device in accordance with a first embodiment, and FIG. 1B is a cross-sectional view of the acoustic wave device in accordance with the first embodiment. The arrangement direction of the electrode fingers is defined as an X direction, the extending direction of the electrode fingers is defined as a Y direction, and the stacking direction of a support substrate and a piezoelectric layer is defined as a Z direction. The X direction, the Y direction, and the Z direction do not necessarily correspond to the X-axis orientation and the Y-axis orientation of the crystal orientations of the piezoelectric layer. In the case that the piezoelectric layer is a rotated Y-cut X-propagation substrate, the X direction is the X-axis orientation of the crystal orientations.

As illustrated in FIG. 1A and FIG. 1B, in the acoustic wave device of the first embodiment, a piezoelectric layer 15 is provided on a support substrate 10. An insulating layer 17 is provided between the support substrate 10 and the piezoelectric layer 15. The insulating layer 17 includes insulating layers 11 to 14 provided on the support substrate 10. A surface 31 of the support substrate 10 corresponds to the interface between the support substrate 10 and the insulating layer 11, and is an uneven surface. A surface 32 of the insulating layer 11 corresponds to the interface between the insulating layers 11 and 12, and is an uneven surface. A surface 33 of the insulating layer 12 corresponds to the interface between the insulating layer 12 and the insulating layer 13 and is a flat surface. A surface 34 of the insulating layer 13 corresponds to the interface between the insulating layer 13 and the insulating layer 14 or the interface between the insulating layer 13 and the piezoelectric layer 15, and is a flat surface. The thicknesses of the insulating layers 11 to 14 and the piezoelectric layer 15 are T1 to T5, respectively. Since the surfaces 31 and 32 are uneven, the thicknesses of the insulating layers 11 and 12 are average thicknesses. The height H1 of a void 30 is substantially equal to the thickness T1 of the insulating layer 11. The distance H2 between the tip of the void 30 and the lower surface of the piezoelectric layer 15 is substantially equal to the sum of the thicknesses of the insulating layers 12 to 14 (i.e., T2+T3+T4).

The surface 31 is provided with protrude portions 31a and recess portions 31b. The unevenness of the surface 31 and the unevenness of the surface 32 correspond to each other. The unevenness of the surface 31 and the unevenness of the surface 32 may not necessarily correspond to each other. The protrude portions 31a and the recess portions 31b are irregularly arranged. Intervals D1a to D1c of the protrude portions 31a are different from each other. The insulating layer 11 is provided with a plurality of the voids 30 extending in the Z-direction and penetrating through the insulating layer 11. The width W1 of the void 30 at the piezoelectric layer 15 side is narrower than the width W2 of the void 30 at the support substrate 10 side. No voids are provided in the insulating layers 12 to 14.

An acoustic wave resonator 26 is provided on the piezoelectric layer 15. The acoustic wave resonator 26 has an IDT 22 and reflectors 24. The reflectors 24 are provided at both sides of the IDT 22 in the X direction. The IDT 22 and the reflectors 24 are formed of a metal film 16 on the piezoelectric layer 15.

The IDT 22 includes a pair of comb-shaped electrodes 20 facing each other. The comb-shaped electrode 20 includes a plurality of electrode fingers 18 and a bus bar 19 to which the electrode fingers 18 are coupled. A region where the electrode fingers 18 of the pair of the comb-shaped electrodes 20 overlap as viewed from the X direction is an overlap region 25. The length of the overlap region 25 is the aperture length. In the pair of the comb-shaped electrodes 20, the electrode fingers 18 are alternately provided in at least a part of the overlap region 25. The acoustic wave mainly excited by the electrode fingers 18 in the overlap region 25 propagates mainly in the X direction. The pitch of the electrode fingers 18 of one of the pair of the comb-shaped electrodes 20 is substantially equal to the wavelength λ of the acoustic wave. When the pitch of the electrode fingers 18 (the pitch between the centers of the electrode fingers 18) is represented by D, the pitch of the electrode fingers 18 of one of the comb-shaped electrodes 20 is twice the pitch D. The reflectors 24 reflect the acoustic wave (surface acoustic wave) excited by the electrode fingers of the IDT 22. The acoustic wave is thereby confined within the overlap region 25 of the IDT 22.

The piezoelectric layer 15 is, for example, a monocrystalline lithium tantalate ($LiTaO_3$) layer or a monocrystalline lithium niobate ($LiNbO_3$) layer, for example, a rotated Y-cut X-propagation lithium tantalate layer or a rotated Y-cut X-propagation lithium niobate layer. The thickness T5 of the piezoelectric layers 15 is preferably equal to or less than 1λ, and more preferably equal to or less than 0.5λ to reduce spurious emissions and loss. When the piezoelectric layer 15 is too thin, it is difficult to excite an acoustic wave. Therefore, the thickness T5 is preferably 0.1λ or greater.

The support substrate 10 is, for example, a sapphire substrate, an alumina substrate, a silicon substrate, a spinel substrate, a crystal substrate, a quartz substrate, or a silicon carbide substrate. The sapphire substrate is a monocrystalline $Al_2O_3$ substrate, the alumina substrate is a polycrystalline or amorphous $Al_2O_3$ substrate, the silicon substrate is a monocrystalline or polycrystalline silicon substrate, the spinel substrate is a polycrystalline or amorphous $MgAl_2O_4$ substrate, the quartz substrate is a monocrystalline $SiO_2$ substrate, the quartz substrate is a polycrystalline or amorphous $SiO_2$ substrate, and the silicon carbide substrate is a polycrystalline or monocrystalline SiC substrate. The linear expansion coefficient of the support substrate 10 in the X direction is smaller than the linear expansion coefficient of the piezoelectric layer 15 in the X direction. Thus, the temperature dependence of the frequency of the acoustic wave resonator can be reduced. The acoustic velocity of the bulk wave propagating through the support substrate 10 is higher than the acoustic velocities of the bulk waves propagating through the insulating layers 11 and 12. The acoustic velocity of the bulk wave propagating through the support substrate 10 may be lower than the acoustic velocities of the bulk waves propagating through the insulating layers 11 and 12.

The acoustic velocities of the bulk wave propagating through the insulating layers 11 and 12 are higher than the acoustic velocity of the bulk wave propagating through the insulating layer 13. Thus, the energy of the acoustic wave of the main response is confined in the piezoelectric layer 15 and the insulating layer 13. The insulating layers 11 and 12 are, for example, polycrystalline or amorphous, and are an aluminum oxide film, a silicon nitride film, an aluminum nitride film, a silicon film, or a silicon carbide film. The thickness T1 of the insulating layer 11 is preferably 0.2λ or greater and more preferably 0.5λ or greater to increase the height of the void 30. To confine the acoustic wave in the insulating layer 13 and the piezoelectric layer 15, the thickness T2 of the insulating layer 12 is preferably 0.3λ or greater, and more preferably 1λ or greater. When the insulating layer 11 is close to the piezoelectric layer 15, the main response may deteriorate. To improve characteristics, each of the thicknesses T1 and T2 is preferably 10λ or less.

The insulating layer 13 is, for example, a temperature compensation film and has a temperature coefficient of elastic constant that is opposite in sign to that of the temperature coefficient of elastic constant of the piezoelectric layer 15. For example, the temperature coefficient of elastic constant of the piezoelectric layer 15 is negative, and the temperature coefficient of elastic constant of the insulating layer 13 is positive. The insulating layer 13 is an insulating layer containing silicon oxide ($SiO_2$) as a main component, and is, for example, a silicon oxide ($SiO_2$) film containing no additive element or an additive element such as fluorine, and is, for example, polycrystalline or amorphous. Further, the insulating layer 13 is not limited to a polycrystalline or amorphous silicon oxide film, and may be made of monocrystalline quartz ($SiO_2$). This configuration can reduce the temperature coefficient of frequency of the acoustic wave resonator. In the case that the insulating layer 13 is a silicon oxide film, the acoustic velocity of the bulk wave propagating through the insulating layer 13 is lower than the acoustic velocity of the bulk wave propagating through the piezoelectric layer 15.

In order for the insulating layer 13 to have the function of temperature compensation, the energy of the acoustic wave of the main response is required to be present in the insulating layer 13 to some extent. Although the section in which the energy of the surface acoustic wave is concentrated depends on the type of the surface acoustic wave, typically, the energy of the surface acoustic wave is concentrated in the section from the upper surface of the piezoelectric layer 15 to the depth of 2λ (λ is the wavelength of the acoustic wave), particularly in the section from the upper surface of the piezoelectric layer 15 to the depth of λ. Therefore, the distance (thickness T3+T4+T5) from the lower surface of the insulating layer 13 to the upper surface of the piezoelectric layer 15 is preferably 2λ or less, and more preferably 1λ or less.

The insulating layer 14 is, for example, a bonding layer, and is a layer that bonds the insulating layer 13 and the piezoelectric layer 15. In the case that the insulating layer 13 is a silicon oxide film, it is difficult to directly bond the piezoelectric layer 15 and the insulating layer 13 using a surface activation method. In such a case, an insulating layer formed of a material different from that of the insulating layer 13 is provided as the insulating layer 14. The insulating layer 14 is, for example, polycrystalline or amorphous, and is an aluminum oxide film, a silicon nitride film, an aluminum nitride film, a silicon film, or a silicon carbide film. In order to confine the energy of the acoustic wave in the insulating layer 13, the insulating layer 14 preferably has a thickness T4 of 100 nm or less. In order to allow the insulating layer 14 to function as a bonding layer, the thickness T4 is preferably 1 nm or greater.

The metal film 16 is a film containing, for example, aluminum (Al), copper (Cu), or molybdenum (Mo) as a main component. An adhesion film such as a titanium (Ti) film or a chromium (Cr) film may be provided between the electrode fingers 18 and the piezoelectric layer 15. The adhesion film is thinner than the electrode finger 18. An insulating layer may be provided so as to cover the electrode fingers 18. The insulating layer functions as a protective film or a temperature compensation film.

The wavelength λ of the acoustic wave is, for example, 1 μm to 6 μm. When two electrode fingers 18 are defined as a pair, the number of pairs of the electrode fingers 18 is, for example, 20 to 300 pairs. The duty ratio of the IDT 22 is (the width of the electrode finger 18)/(the pitch of the electrode fingers 18), and is, for example, 30% to 70%. The aperture length of the IDT 22 is, for example, 10λ to 50λ. The wavelength λ of the acoustic wave is twice the average pitch D of the electrode fingers 18. The average pitch of the electrode fingers 18 can be calculated by dividing the width of the IDT 22 in the X direction by the number of the electrode fingers 18.

Figure 2:
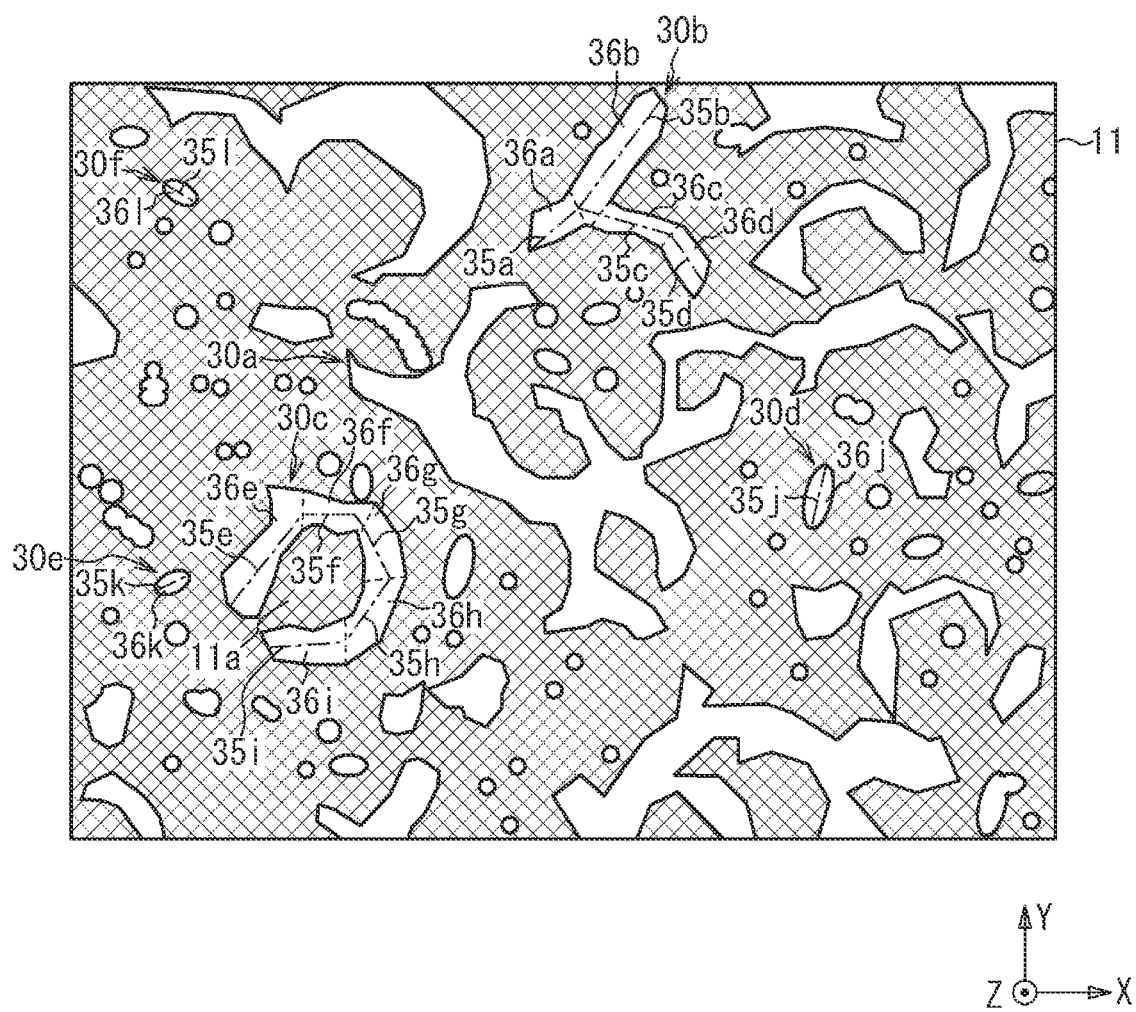
FIG. 2 is a plan view of the upper surface of an insulating layer 11 in the first embodiment.

FIG. 2 is a plan view of the upper surface of the insulating layer 11 in the first embodiment. As illustrated in FIG. 2, the planar shapes of the voids 30 are irregular. In a void 30b, a plurality of voids 36a to 36d have center lines 35a to 35d extending in different directions, respectively. For example, the center lines 35a to 35c extend from one point in three different directions. Thus, in the void 30b, a plurality of the voids 36a to 36c radially extend from one point. Each of the voids 36a to 36d has a planar shape in which the width in the extending direction is wider than the width in a direction orthogonal to the extending direction, and the extending directions of the voids 36a to 36d are different from each other.

In a void 30c, a plurality of voids 36e to 36i have center lines 35e to 35i extending in different directions, respectively, and the voids 36e to 36i are provided so as to surround a partial region 11a of the insulating layer 11. Each of the voids 36e to 36i has a planar shape in which the width in the extending direction is wider than the width in a direction orthogonal to the extending direction, and the extending direction of the voids 36e to 36i are different from each other.

A void 30a has a complicated planar shape including a planar shape in which a plurality of voids radially extend from one point and a planar shape in which a plurality of voids surround a partial region of the insulating layer 11.

Voids 30d to 30f are single voids 36j to 36l, respectively, and the extending directions of center lines 35j to 35l of the voids 36j to 36l are different from each other.

Manufacturing Method of the First Embodiment

FIG. 3A to FIG. 4C are cross-sectional views illustrating a method of manufacturing the acoustic wave device in accordance with the first embodiment. The manufacturing method illustrated in FIG. 3A to FIG. 4C is performed in a wafer state, and the acoustic wave device of the first embodiment is formed by finally separating the wafer into individual pieces. Although a plurality of acoustic wave devices are formed on the wafer, only one acoustic wave device is illustrated in FIG. 3A to FIG. 4C.

Figure 3A:
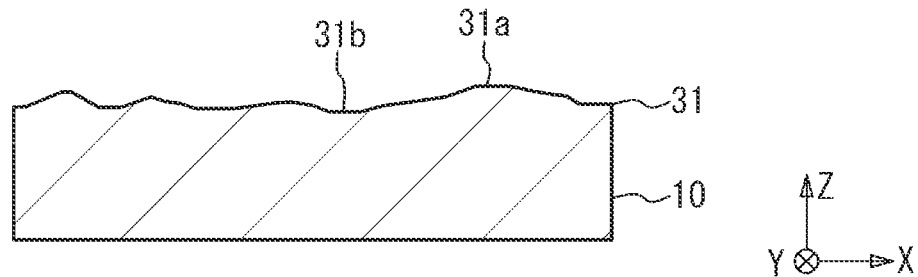
FIG. 3A to FIG. 3C are cross-sectional views illustrating a method of manufacturing the acoustic wave device in accordance with the first embodiment.

As illustrated in FIG. 3A, the support substrate 10 in a wafer state is prepared. The upper surface of the support substrate 10 before processing is flat, and the arithmetic average roughness Ra of the support substrate 10 is, for example, 1 nm or less. By grinding or polishing the surface 31 of the support substrate 10, the surface 31 is roughened. The surface 31 may be roughened using, for example, an etching method. Thus, a plurality of the protrude portions 31a and a plurality of the recess portions 31b are formed on the surface 31. The arithmetic average roughness Ra of the surface of the support substrate 10 is, for example, 0.1 μm or greater.

Figure 3B:
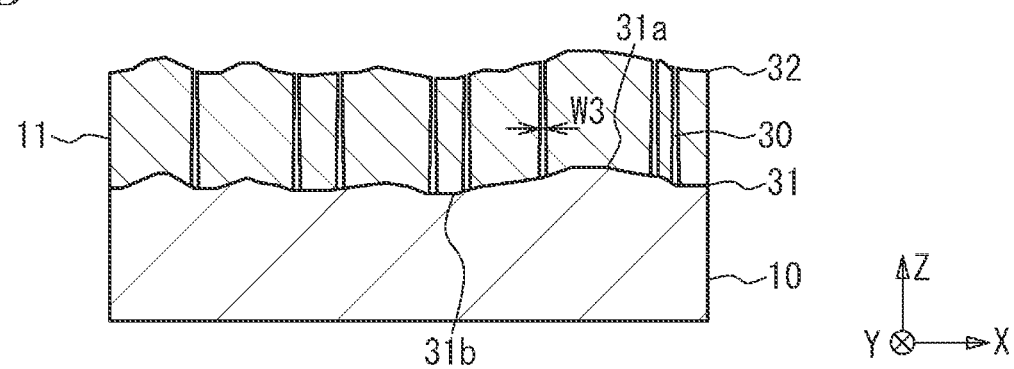

As illustrated in FIG. 3B, the insulating layer 11 is formed on the surface 31 of the support substrate 10 by, for example, sputtering. When a film is formed by sputtering, the film does not have good coverage on an uneven surface. Therefore, by appropriately setting the film forming conditions in the sputtering, the voids 30 extending in the Z direction from the recess portions 31b are formed in the insulating layer 11. The void 30 has a width W3 equal to or less than 100 nm, for example, and equal to or less than 10 nm. The surface 32 of the insulating layer 11 becomes an uneven surface reflecting the unevenness of the surface 31 of the support substrate 10. The surface 32 may be an uneven surface having an arithmetic average roughness Ra similar to that of the surface 31, or may be an uneven surface smoother than the surface 31 (that is, having an Ra smaller than that of the surface 31). The insulating layer 11 may be formed by chemical vapor deposition (CVD) other than sputtering.

Figure 3C:
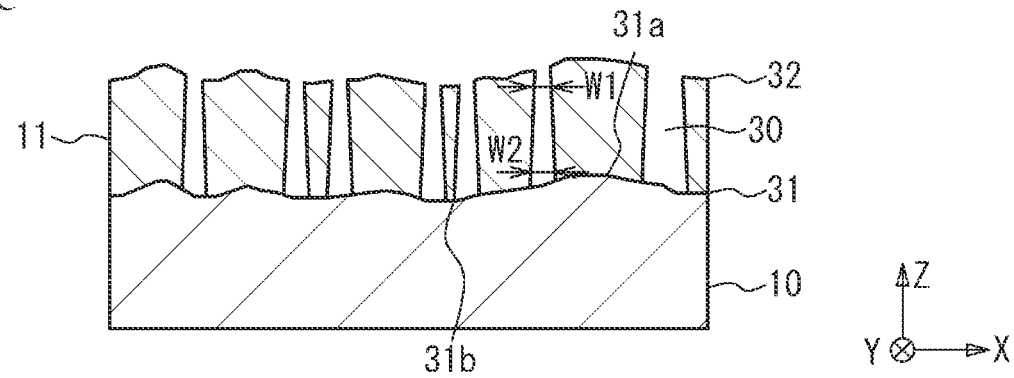

As illustrated in FIG. 3C, the part in contact with the void 30 of the insulating layer 11 is removed by etching. As the etching method, for example, a wet etching method is used. When the etching solution enters the void 30, the part in contact with the void 30 of the insulating layer 11 is etched. For example, when the etching solution penetrates along the grain boundary, the part in the vicinity of the grain boundary of the insulating layer 11 is etched, and the void 30 having a complicated planar shape as illustrated in FIG. 2 is formed. In addition, the insulating layer 11 is likely to be sparse around the grain boundary near the support substrate 10. Therefore, the insulating layer 11 around the grain boundary near the support substrate 10 is more easily etched than the insulating layer 11 around the grain boundary in the upper portion. Therefore, the width W2 of the void 30 at the support substrate 10 side becomes larger than the width W1 of the void 30 at the upper surface side. The widths W1 and W2 of the void 30 are larger than the width W3 of the void 30 in FIG. 3B, and are, for example, 100 nm or greater.

Figure 4A:
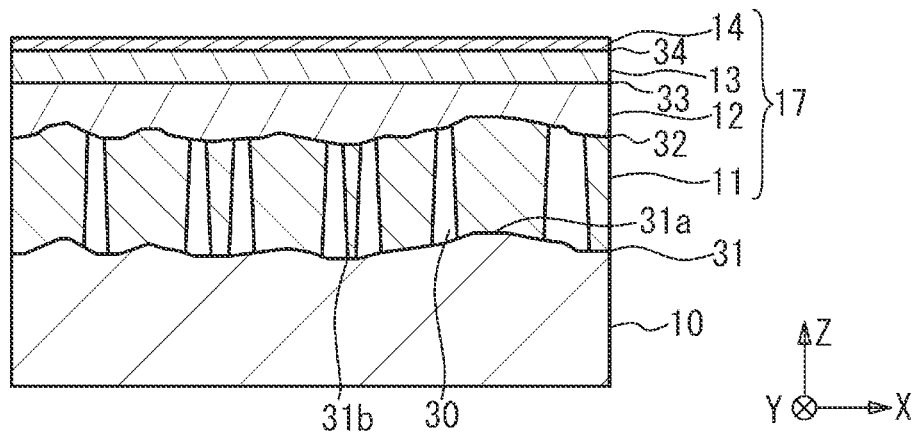
FIG. 4A to FIG. 4C are cross-sectional views illustrating the method of manufacturing the acoustic wave device in accordance with the first embodiment.

As illustrated in FIG. 4A, the insulating layer 12 is formed on the surface 32 of the insulating layer 11. The upper surface of the insulating layer 12 is planarized by, for example, chemical mechanical polishing (CMP). Insulating layers 13 and 14 are formed on the insulating layer 12. The insulating layers 12 to 14 are formed by, for example, sputtering, vacuum evaporation, or CVD. In the case that the insulating layers 12 and 14 are aluminum oxide films, the insulating layers 12 and 14 are formed by, for example, sputtering. In the case that the insulating layer 13 is a silicon oxide film, the insulating layer 13 is formed by, for example, CVD. The insulating layer 17 is formed from the insulating layers 11 to 14.

Figure 4B:
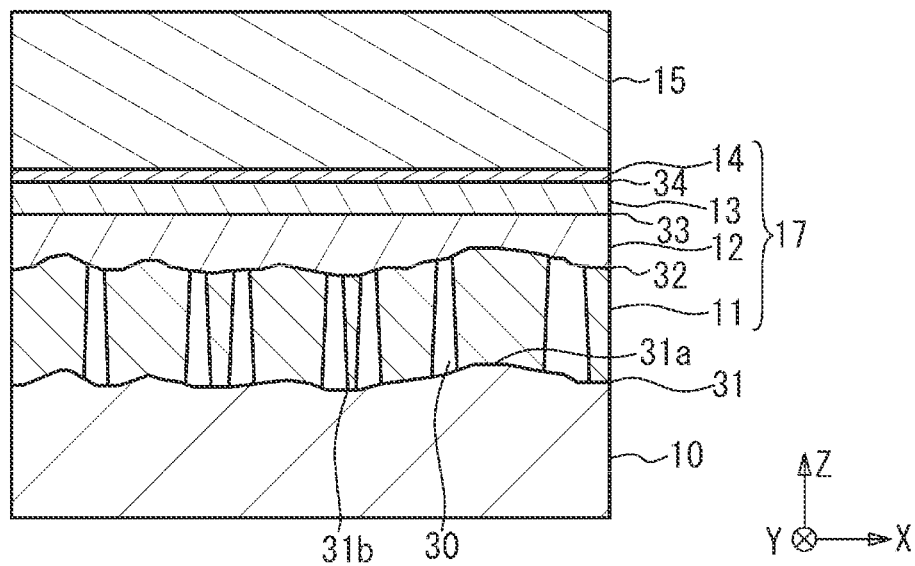

As illustrated in FIG. 4B, the insulating layer 14 and the piezoelectric layer 15 are bonded to each other. The insulating layer 13 and the piezoelectric layer 15 may be directly bonded to each other without the insulating layer 14 interposed therebetween. For example, a surface activation method is used for the bonding. The insulating layer 14 may be formed of an adhesive such as a resin, and the insulating layer 13 and the piezoelectric layer 15 may be bonded to each other through the adhesive.

Figure 4C:
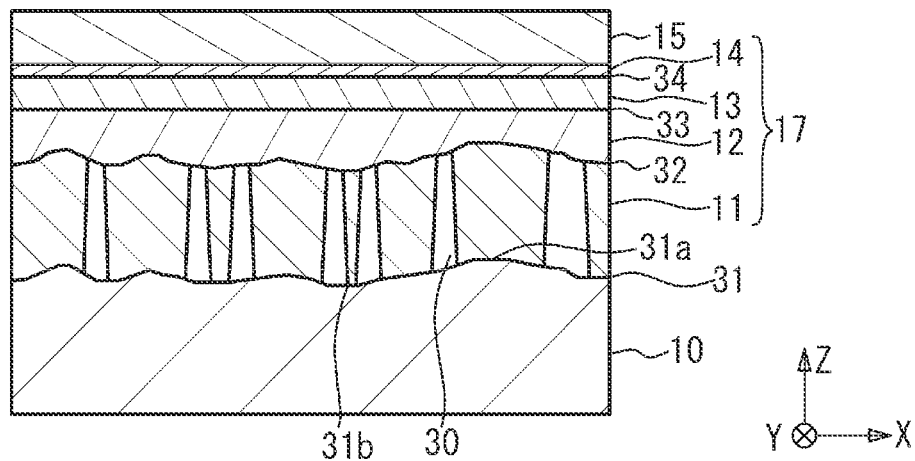

As illustrated in FIG. 4C, the upper surface of the piezoelectric layer 15 is planarized by, for example, CMP, and the piezoelectric layer 15 is thinned. Through the above process, a wafer for manufacturing an acoustic wave device is manufactured. Thereafter, as illustrated in FIG. 1B, the acoustic wave resonator 26 made of the metal film 16 is formed on the upper surface of the piezoelectric layer 15. Finally, by separating the wafer into individual pieces, the acoustic wave device 100 in accordance with the first embodiment is manufactured.

Experiment 1

Seven samples A1 to A3, B1 to B3, and C1 were fabricated, and an experiment for evaluating spurious emissions was performed. The experimental conditions are as follows.

Sample A1

Wavelength λ of the acoustic wave: 6.0 μm
Support substrate 10: Sapphire substrate
  Surface 31: Rough surface with an arithmetic average roughness Ra of 0.15 μm
Insulating layer 11: Aluminum oxide layer with a thickness T1 of 0.5λ
  Width of the void 30: 0.1 to several μm
Insulating layer 12: Aluminum oxide layer with a thickness T2 of 1.5λ
Insulating layer 13: Silicon oxide layer with a thickness T3 of 0.2λ.
Insulating layer 14: Present
Piezoelectric layer 15: 42° rotated Y-cut X-propagation lithium tantalate layer with a thickness T4 of 0.3%
Metal film 16: Aluminum film with a thickness of 0.1λ

Sample A2

Wavelength λ of the acoustic wave: 2.0 μm
Support substrate 10: Sapphire substrate
  Surface 31: Rough surface with an arithmetic average roughness Ra of 0.15 μm
Insulating layer 11: Aluminum oxide layer with a thickness T1 of 1.5λ
  Width of the void 30: 0.1 to several μm
Insulating layer 12: Aluminum oxide layer with a thickness T2 of 1.5λ
Insulating layer 13: Silicon oxide layer with a thickness T3 of 0.2λ
Insulating layer 14: Present
Piezoelectric layer 15: 42° rotated Y-cut X-propagation lithium tantalate layer with a thickness T4 of 0.3λ
Metal film 16: Aluminum film with a thickness of 0.1λ

Sample A3

Wavelength λ of the acoustic wave: 1.5 μm
Support substrate 10: Sapphire substrate
  Surface 31: Rough surface with an arithmetic average roughness Ra of 0.15 μm
Insulating layer 11: Aluminum oxide layer with a thickness T1 of 0.7λ
  Width of the void 30: 0.1 to several μm
Insulating layer 12: Aluminum oxide layer with a thickness T2 of 2.0λ
Insulating layer 13: Silicon oxide layer with a thickness T3 of 0.2λ
Insulating layer 14: Present
Piezoelectric layer 15: 42° rotated Y-cut X-propagation lithium tantalate layer with a thickness T4 of 0.3λ
Metal film 16: Aluminum film with a thickness of 0.1.

Sample B1

Wavelength λ of the acoustic wave: 6.0 μm
Support substrate 10: Sapphire substrate Surface 31: Rough surface with an arithmetic average roughness Ra of 0.15 μm
Insulating layer 11: Absent
Insulating layer 12: Aluminum oxide layer with a thickness T2 of 1.5λ
Insulating layer 13: Silicon oxide layer with a thickness T3 of 0.2λ
Insulating layer 14: Present
Piezoelectric layer 15: 42° rotated Y-cut X-propagation lithium tantalate layer with a thickness T4 of 0.3λ
Metal film 16: Aluminum film with a thickness of 0.1λ

Sample B2

Wavelength λ of the acoustic wave: 2.0 μm
Support substrate 10: Sapphire substrate
    Surface 31: Rough surface with an arithmetic average roughness Ra of 0.15 μm
Insulating layer 11: Absent
Insulating layer 12: Aluminum oxide layer with a thickness T2 of 3.0λ
Insulating layer 13: Silicon oxide layer with a thickness T3 of 0.2λ
Insulating layer 14: Present
Piezoelectric layer 15: 42° rotated Y-cut X-propagation lithium tantalate layer with a thickness T4 of 0.3λ
Metal film 16: Aluminum film with a thickness of 0.1λ

Sample B3

Wavelength λ of the acoustic wave: 1.5 μm
Support substrate 10: Sapphire substrate
    Surface 31: Rough surface with an arithmetic average roughness Ra of 0.15 μm
Insulating layer 11: Absent
Insulating layer 12: Aluminum oxide layer with a thickness T2 of 6.0λ
Insulating layer 13: Silicon oxide layer with a thickness T3 of 0.2λ
Insulating layer 14: Present
Piezoelectric layer 15: 42° rotated Y-cut X-propagation lithium tantalate layer with a thickness T4 of 0.3λ
Metal film 16: Aluminum film with a thickness of 0.1λ

The samples A1 to A3 correspond to the first embodiment, and the samples B1 to B3 correspond to a first comparative example in which the insulating layer 11 is not provided and the void 30 is not provided. The samples A1 to A3 were fabricated by the method described in FIG. 3A to FIG. 4C. In the samples A1 to A3, the area of the voids 30 in a cross-sectional view was about 8% of the area of the insulating layer 11 including the voids 30. The samples B1 to B3 were fabricated by the method described with reference to FIG. 3A to FIG. 4C, except that the insulating layer 11 was not formed.

Figure 5:
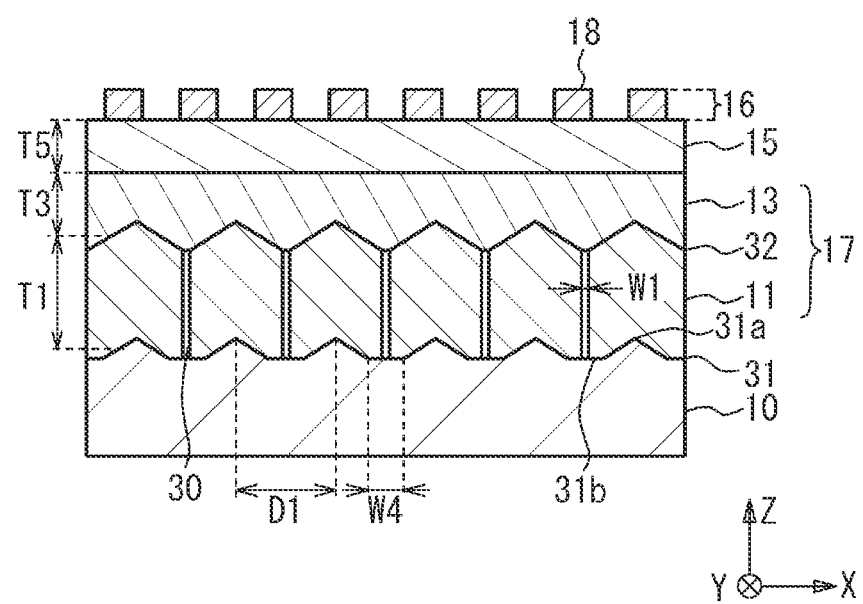
FIG. 5 is a cross-sectional view of an acoustic wave device in accordance with a second comparative example.

FIG. 5 is a cross-sectional view of an acoustic wave device in accordance with a second comparative example. As illustrated in FIG. 5, the surface 31 has a plurality of the protrude portions 31a and a plurality of the recess portions 31b regularly arranged at a constant interval D1. The recess portion 31b is flat, and the width of the flat surface is W4. The insulating layer 11 has a plurality of the voids 30 penetrating through the insulating layer 11 from the recess portions 31b. The width W1 of the void 30 is constant in the Z direction. The insulating layers 12 and 14 are not provided. Other configurations are the same as those of the first embodiment. The manufacturing method of the second comparative example is as follows. In FIG. 3A, a regular uneven surface is formed on the upper surface of the support substrate 10. In FIG. 3B, the insulating layer 11 is formed. Thereafter, the insulating layer 13 is formed as illustrated in FIG. 4A without performing etching for widening the void 30 as illustrated in FIG. 3C. The subsequent manufacturing method of the second comparative example is the same as that of the first embodiment.

Sample C1

Wavelength λ of the acoustic wave: 5.0 μm
Support substrate 10: Sapphire substrate
    Surface 31: D1=0.8λ, W4=0.4λ
Insulating layer 11: Aluminum oxide layer with a thickness T1 of 0.3λ
    Width W1 of the void 30: about 0.025λ
Insulating layer 12: Absent
Insulating layer 13: Silicon oxide layer with a thickness T3 of 0.4λ
Insulating layer 14: Present
Piezoelectric layer 15: 42° rotated Y-cut X-propagation lithium tantalate layer with a thickness T4 of 0.4λ
Metal film 16: Aluminum film with a thickness of 0.1λ

Although the voids 30 are provided in the insulating layer 11 of the sample C1, a plurality of the voids 30 extending in different directions in a plan view as in the first embodiment are not provided, and the voids 30 extend in one direction (the Y direction) in a plan view.

Figure 6:
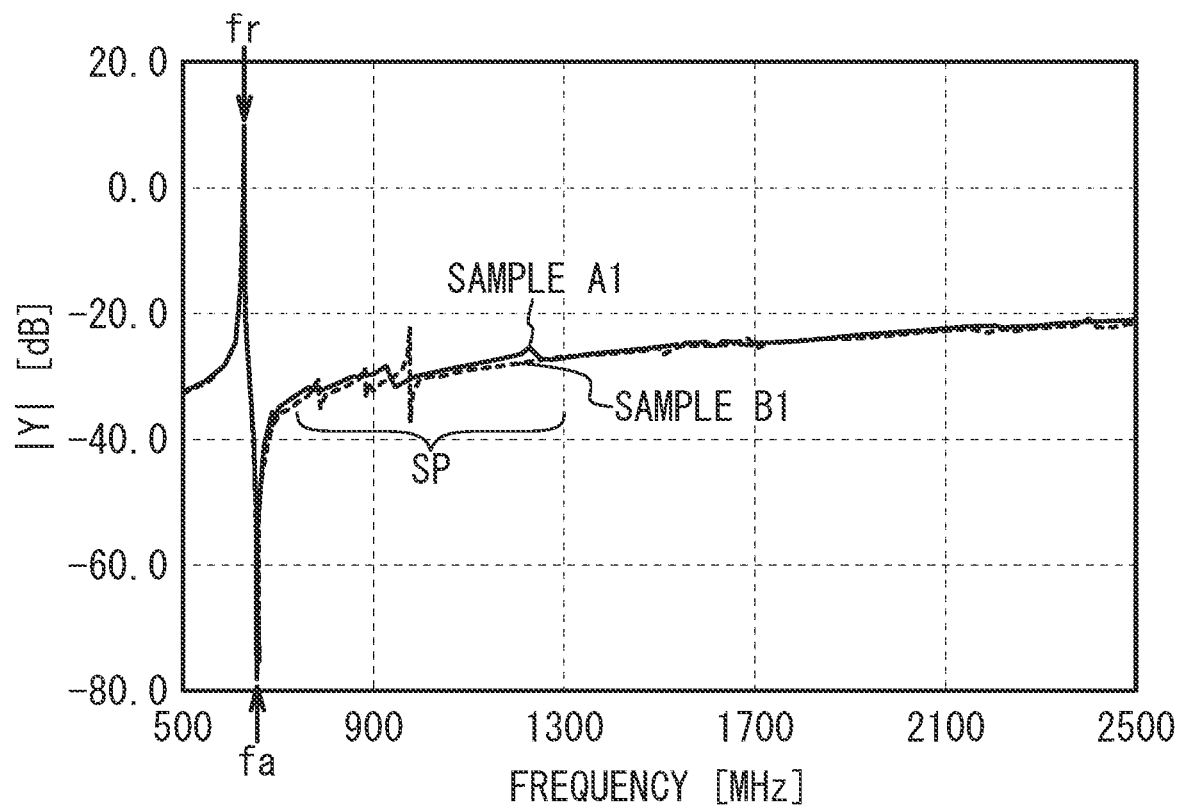
FIG. 6 is a graph of admittance |Y| versus frequency in samples A1 and B1 in an Experiment 1.
Figure 7:
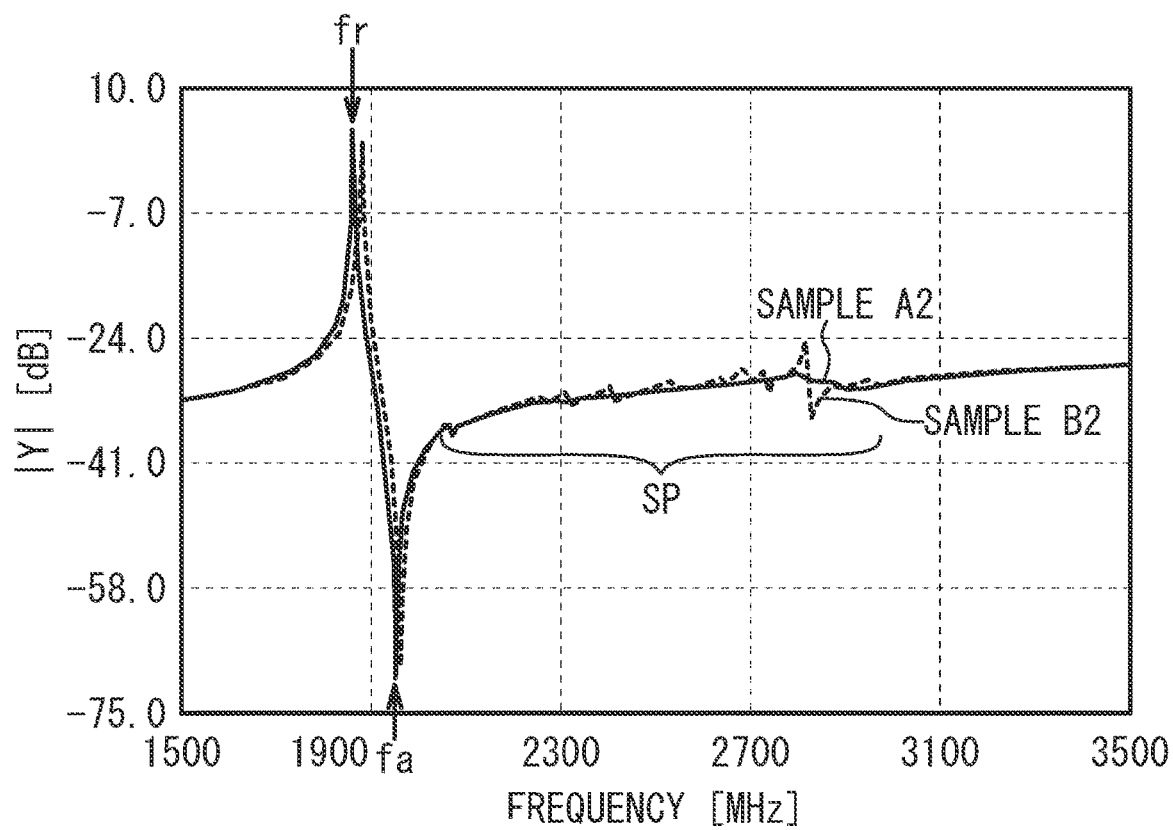
FIG. 7 is a graph of admittance |Y| versus frequency in samples A2 and B2 in Experiment 1.
Figure 8:
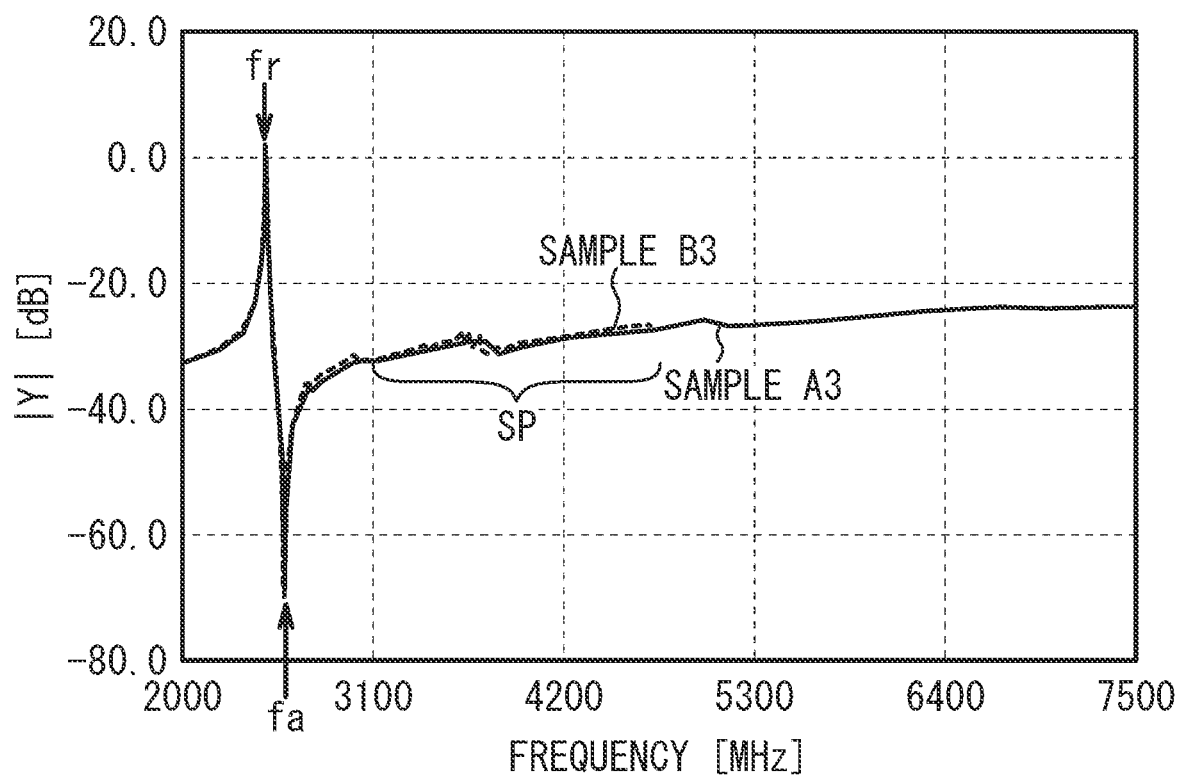
FIG. 8 is a graph of admittance |Y| versus frequency in samples A3 and B3 in Experiment 1.

FIG. 6 is a graph of admittance |Y| versus frequency in the samples A1 and B1 in Experiment 1. FIG. 7 is a graph of admittance |Y| versus frequency in the samples A2 and B2 in Experiment 1. FIG. 8 is a graph of admittance |Y| versus frequency in the samples A3 and B3 in Experiment 1. As presented in FIG. 6 to FIG. 8, a main response having a peak and a bottom at the resonance frequency fr and the antiresonance frequency fa due to the surface acoustic wave of the main mode is observed. The main responses are not significantly different between the samples A1 and B1, between the samples A2 and B2, and between the samples A3 and B3. A spurious response Sp due to the bulk wave is observed at frequencies higher than the main response. The difference ΔY between the local maximum and the local minimum of |Y| in the spurious response Sp was calculated. In the spurious response, the reflection coefficient (the absolute value of S11) greatly varies depending on frequencies. The minimum value of the reflection coefficient in the spurious response was defined as the reflection coefficient Γ Preferably, the reflection coefficient Γ is close to 1.

The following presents ΔY and r of the samples A1 to A3 and B1 to B3.
    Sample A1: ΔY=4 dB Γ=0.7
    Sample B1: ΔY=20 dB Γ=0.1
    Sample A2: ΔY=2 dB Γ=0.8
    Sample B2: ΔY=10 dB Γ=0.3
    Sample A3: ΔY=2 dB Γ=0.8
    Sample B3: ΔY=5 dB Γ=0.6

The samples A1 to A3 have smaller ΔY than the samples B1 to B3, and have a reflection coefficient Γ close to 1, regardless of the wavelength of the acoustic wave. As seen from the above, the samples A1 to A3 of the first embodiment can reduce the spurious response more than the samples B1 to B3 of the first comparative example in which no void 30 is provided.

Figure 9:
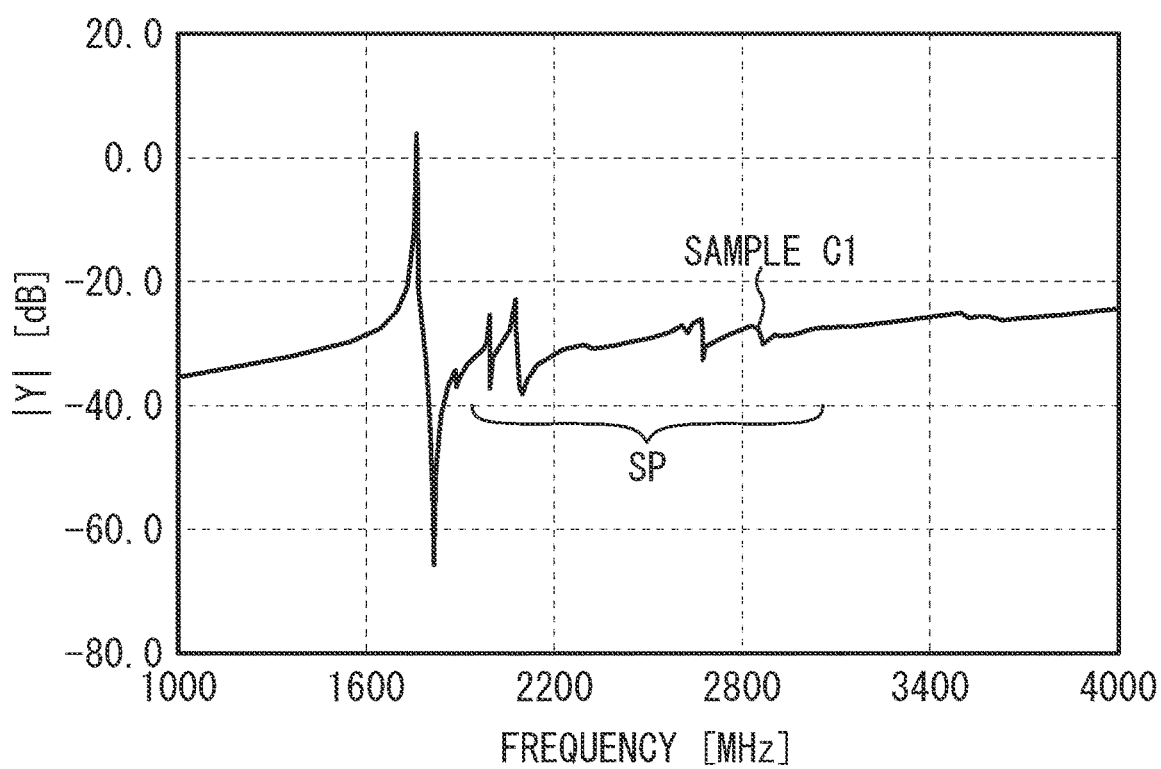
FIG. 9 is a graph of admittance |Y| versus frequency in a sample C1 in Experiment 1.

FIG. 9 is a graph of admittance |Y| versus frequency in the sample C1 in Experiment 1. As presented in FIG. 9. ΔY of the spurious response Sp in the sample C1 is smaller than those in the samples B1 to B3, but larger than those in the samples A1 to A3. As seen from the above, in the sample C1, the spurious response Sp does not become as small as in the samples A1 to A3.

The reason why the spurious emission is reduced in the samples A1 to A3 of the first embodiment is considered as follows. The main response is mainly a response due to a surface acoustic wave (for example, a shear horizontal (SH) wave), and the spurious response is mainly a response due to a bulk wave. When a bulk wave excited by the IDT 22 is reflected by the interface between the support substrate 10 and the insulating layer 17 and returns to the IDT 22, a spurious response occurs. By making the surface 31 of the support substrate 10 uneven, the bulk wave is scattered and the spurious response is suppressed. However, suppression of the spurious response is not sufficient. The voids 30 attenuate the bulk wave that cannot be completely scattered by the unevenness of the surface 31 alone. The propagation direction of the bulk wave in a plan view is not limited to the X direction. Therefore, a plurality of the voids 30 extending in different directions intersecting with each other are provided. This structure allows the voids 30 to attenuate bulk waves propagating in various directions. Thus, it is considered that the effect of reducing spurious emissions is enhanced.

Although the voids 30 are present in the insulating layer 11 also in the sample C1, the extending directions of the voids 30 in a plan view are the same direction in the sample C1. By contrast, in the samples A1 to A3, the extending directions of the voids 30 are different as illustrated in FIG. 2. Accordingly, it is considered that the bulk wave propagating through the insulating layer 11 is further attenuated, and spurious emissions are more reduced in the samples A1 to A3 than in the sample C1.

First Variation of the First Embodiment

Figure 10:
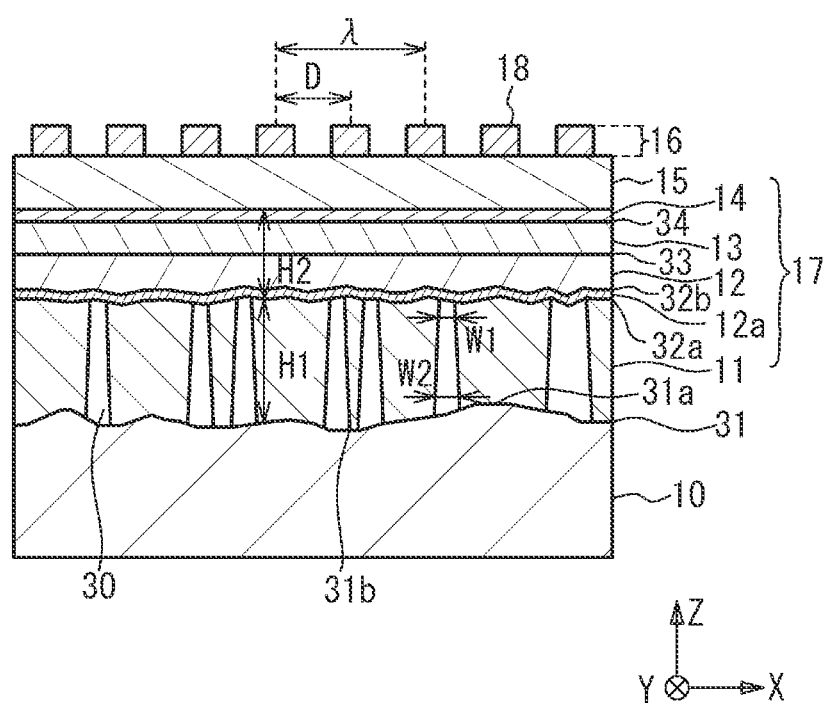
FIG. 10 is a cross-sectional view of an acoustic wave device in accordance with a first variation of the first embodiment.

FIG. 10 is a cross-sectional view of an acoustic wave device in accordance with a first variation of the first embodiment. As illustrated in FIG. 10, in the first variation of the first embodiment, an insulating layer 12a is provided between the insulating layer 11 and the insulating layer 12. The insulating layer 12a functions as a barrier layer for preventing the voids 30 from being formed in the insulating layer 12 when the insulating layer 12 is formed on the insulating layer 11. A surface 32a between the insulating layers 11 and 12a is an uneven surface having an arithmetic average roughness Ra approximately equal to that of the surface 31 or an uneven surface having an arithmetic average roughness Ra smaller than that of the surface 31. A surface 32b between the insulating layers 12a and 12 is an uneven surface having an arithmetic average roughness Ra approximately equal to that of the surface 32a or an uneven surface having an arithmetic average roughness Ra smaller than that of the surface 31.

Experiment 2

The sample A1 corresponding to the first embodiment and a sample D1 corresponding to the first variation of the first embodiment were fabricated, and an experiment for evaluating spurious emissions was performed. The experimental conditions are as follows.

Sample A1

Wavelength λ of the acoustic wave: 6.0 μm
Support substrate 10: Sapphire substrate
    Surface 31: Rough surface with an arithmetic average roughness Ra of 0.15 μm
Insulating layer 11: Aluminum oxide layer with a thickness T1 of 0.5λ
    Width of the void 30: 0.1 to several μm
Insulating layer 12a: Absent
Insulating layer 12: Aluminum oxide layer with a thickness T2 of 1.5λ
Insulating layer 13: Silicon oxide layer with a thickness T3 of 0.2λ
Insulating layer 14: Present
Piezoelectric layer 15: 42° rotated Y-cut X-propagation lithium tantalate layer with a thickness T4 of 0.3λ
Metal film 16: Aluminum film with a thickness of 0.1λ

Sample D1

Wavelength λ of the acoustic wave: 6.0 μm
Support substrate 10: Sapphire substrate
    Surface 31: Rough surface with an arithmetic average roughness Ra of 0.15 μm
Insulating layer 11: Aluminum oxide layer with a thickness T1 of 0.3λ
    Width of the void 30: 0.1 to several μm
Insulating layer 12a: Silicon oxide layer with a thickness of 0.75 μm
Insulating layer 12: Aluminum oxide layer with a thickness T2 of 1.0λ
Insulating layer 13: Silicon oxide layer with a thickness T3 of 0.1λ
Insulating layer 14: Present
Piezoelectric layer 15: 42° rotated Y-cut X-propagation lithium tantalate layer with a thickness T4 of 0.2λ
Metal film 16: Aluminum film with a thickness of 0.1λ

Figure 11A:
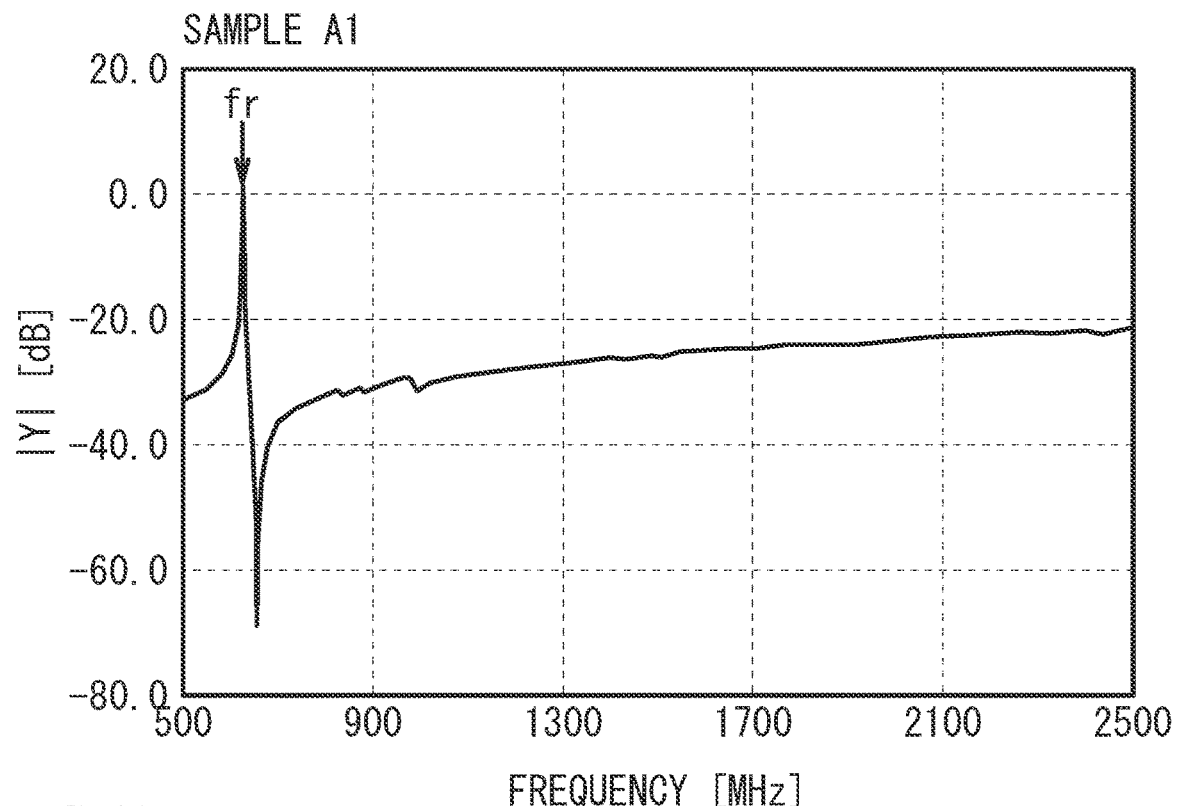
FIG. 11A and FIG. 11B are graphs of admittance |Y| versus frequency in samples A1 and D1 in Experiment 2.
Figure 11B:
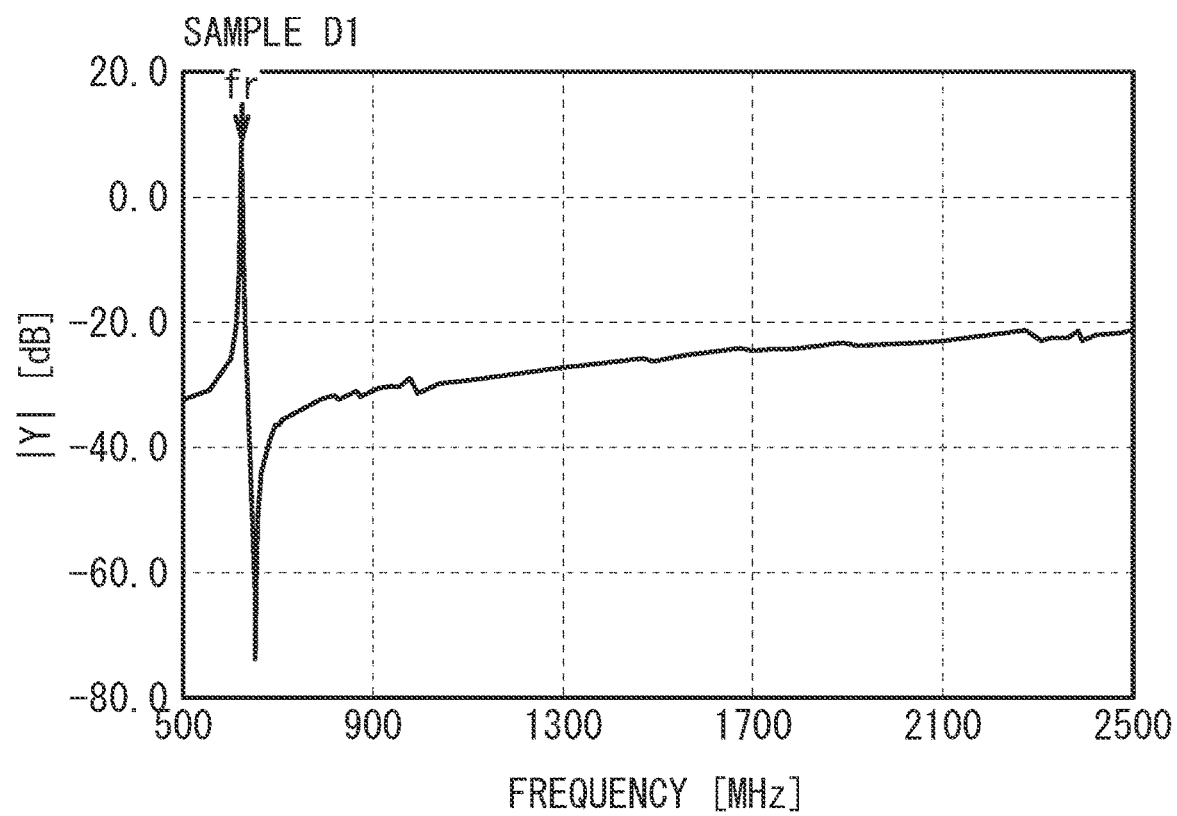

FIG. 11A and FIG. 11B are graphs of admittance |Y| versus frequency in the samples A1 and D1 in Experiment 2. When FIG. 11A and FIG. 11B are compared, the main response due to the surface acoustic wave in the main mode is larger in the sample D1 than in the sample A1. The spurious response is similar between the samples A1 and D1. ΔY of the main response and ΔY of the spurious response are as follows.
    Sample A1: main ΔY=67 dB, spurious ΔY=2 dB
    Sample D1: main ΔY=82 dB, spurious ΔY=2 dB In the first embodiment, in FIG. 4A, when the insulating layer 12 is formed on the insulating layer 11, the voids 30 may extend into the insulating layer 12. When the void 30 extends to the vicinity of the surface 33, the surface acoustic wave in the main mode may be attenuated by the voids 30. As a result, the main response deteriorates. In the first variation of the first embodiment, the insulating layer 12a that functions as a barrier layer that inhibits extension of the void 30 is provided between the insulating layer 11 and the insulating layer 12. This configuration inhibits deterioration of the main response due to the extension of the void 30 into the insulating layer 12.

Second Variation of the First Embodiment

Figure 12:
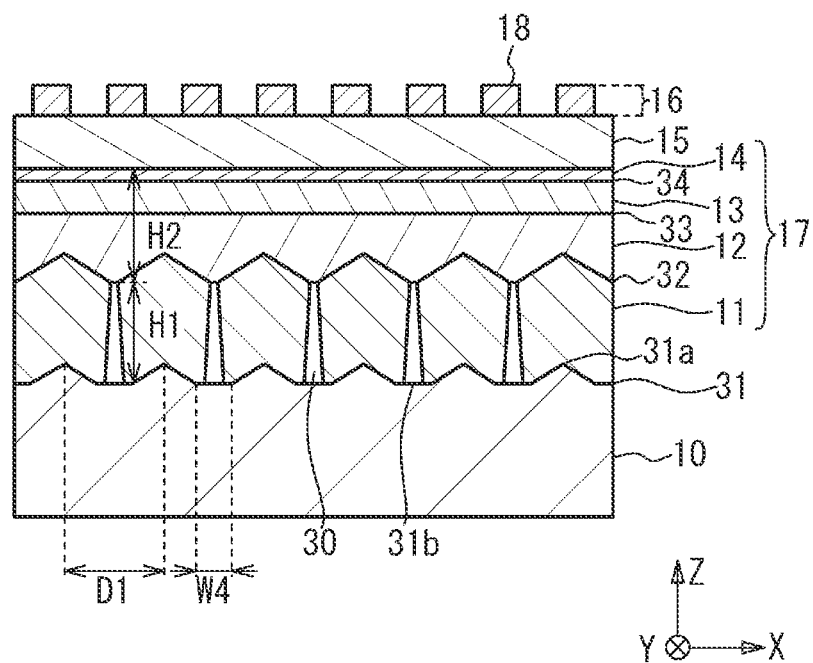
FIG. 12 is a cross-sectional view of an acoustic wave device in accordance with a second variation of the first embodiment.

FIG. 12 is a cross-sectional view of an acoustic wave device in accordance with a second variation of the first embodiment. As illustrated in FIG. 12, the surface 31 of the support substrate 10 is uneven. A plurality of the protrude portions 31a on the surface 31 are regularly arranged, and a plurality of the recess portions 31b are regularly arranged. The interval between the protrude portions 31a (or the recess portions 31b) is D1 and constant. The recess portion 31b is a flat surface. The voids 30 are provided on the recess portions 31b, and the interval between the voids 30 is also D1 and constant.

Figure 13:
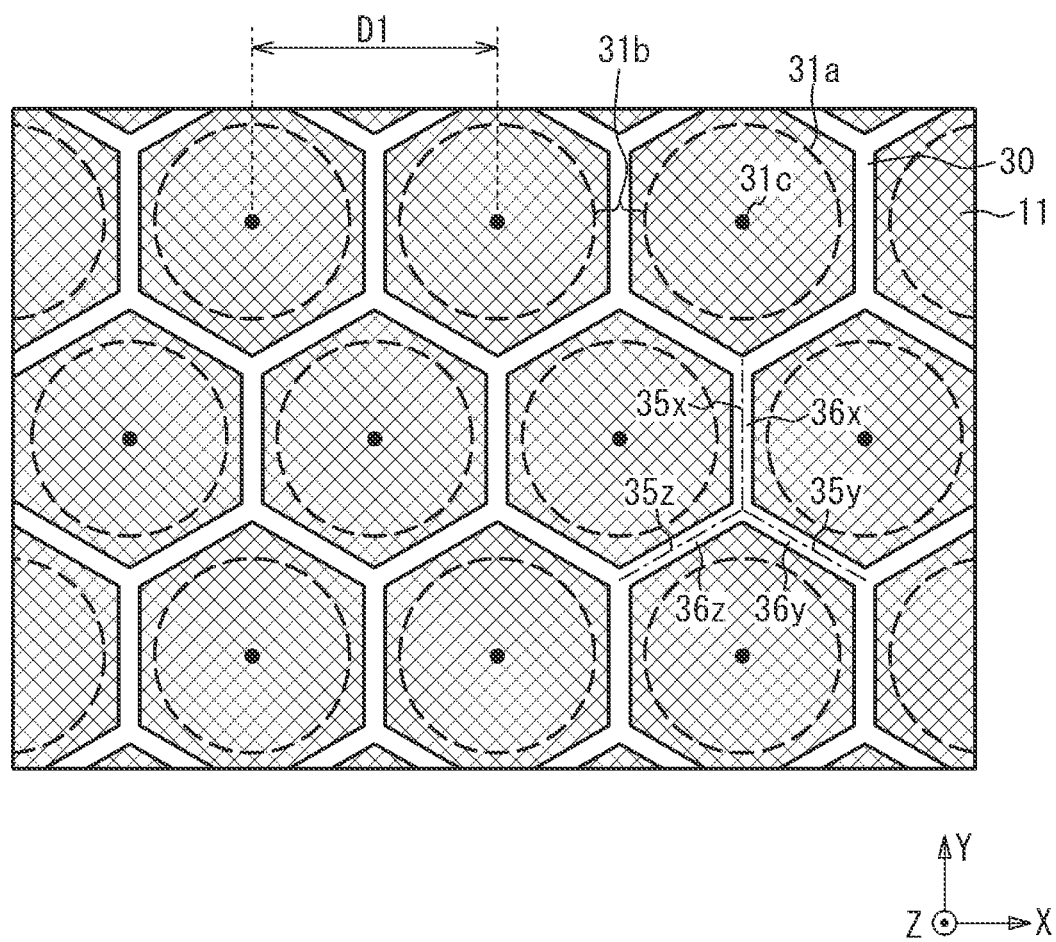
FIG. 13 is a plan view of the upper surface of the insulating layer 11 in accordance with the second variation of the first embodiment.

FIG. 13 is a plan view of the upper surface of the insulating layer 11 in accordance with the second variation of the first embodiment. The protrude portion 31a is illustrated by a dashed line, and the vertex 31c of the protrude portion 31a is indicated by a black dot. As illustrated in FIG. 13, the protrude portion 31a has a conical shape, and has a circular shape in a plan view. The vertex 31c is located at the center of the circular shape. A region between the protrude portions 31a is the recess portion 31b that is a flat surface. The interval D1 between the protrude portions is constant. The void 30 is formed on the recess portion 31b. The planar shape of the void 30 is a honeycomb structure formed by connecting regular hexagons. Center lines 35x to 35z of voids 36x to 36z of the voids 30 extend in different directions. Other configurations are the same as those in the first embodiment, and a description thereof will be omitted.

Third Variation of the First Embodiment

Figure 14:
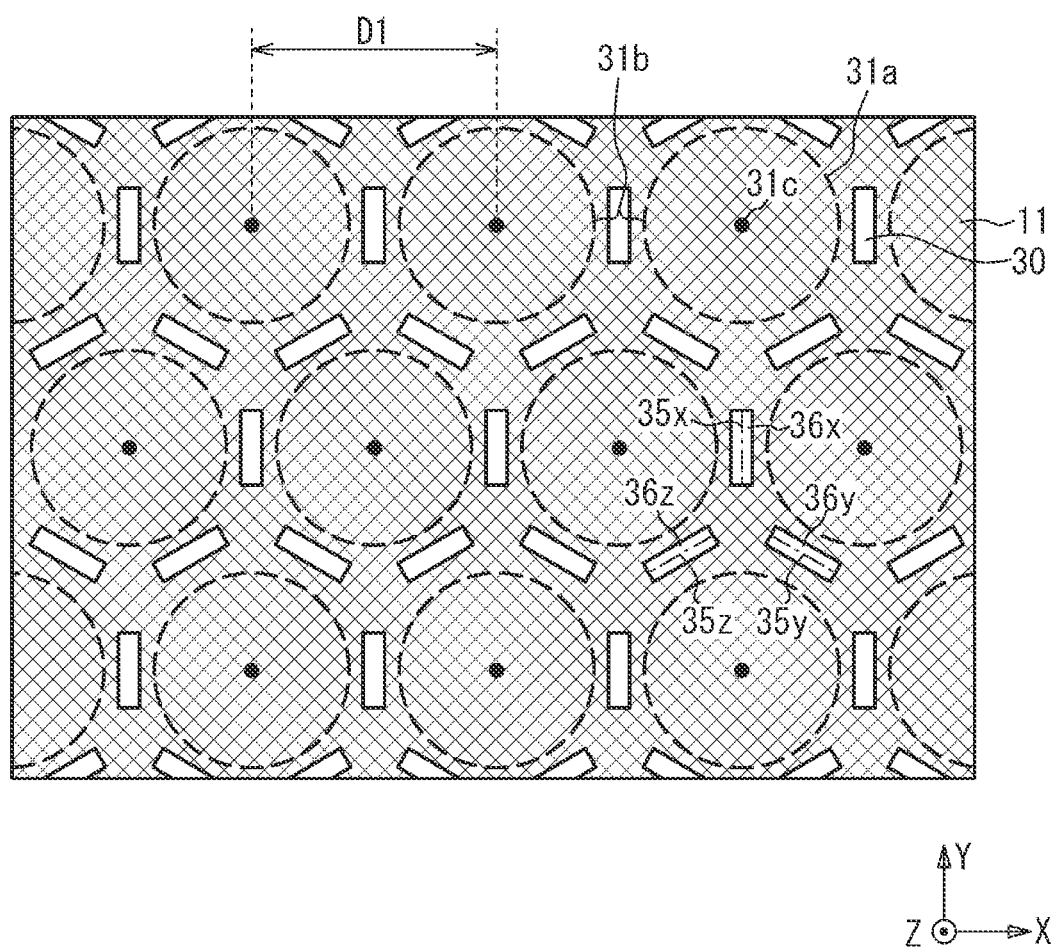
FIG. 14 is a plan view of the upper surface of the insulating layer 11 in accordance with a third variation of the first embodiment.

FIG. 14 is a plan view of the upper surface of the insulating layer 11 in accordance with a third variation of the first embodiment. As illustrated in FIG. 14, the voids 36x to 36z are separated from each other. Other configurations are the same as those of the second variation of the first embodiment, and a description thereof will be omitted.

As in the second and third variations of the first embodiment, the unevenness of the surface 31 of the support substrate 10 may be regular, and the voids 30 may be regularly arranged. A plurality of the voids 36x to 36z may be connected to each other as in the second variation of the first embodiment, or a plurality of the voids 36x to 36z may be separated from each other as in the third variation of the first embodiment. The protrude portion 31a may have a polygonal pyramid shape instead of a conical shape, or may have a columnar shape or a polygonal columnar shape.

Fourth Variation of the First Embodiment

Figure 15A:
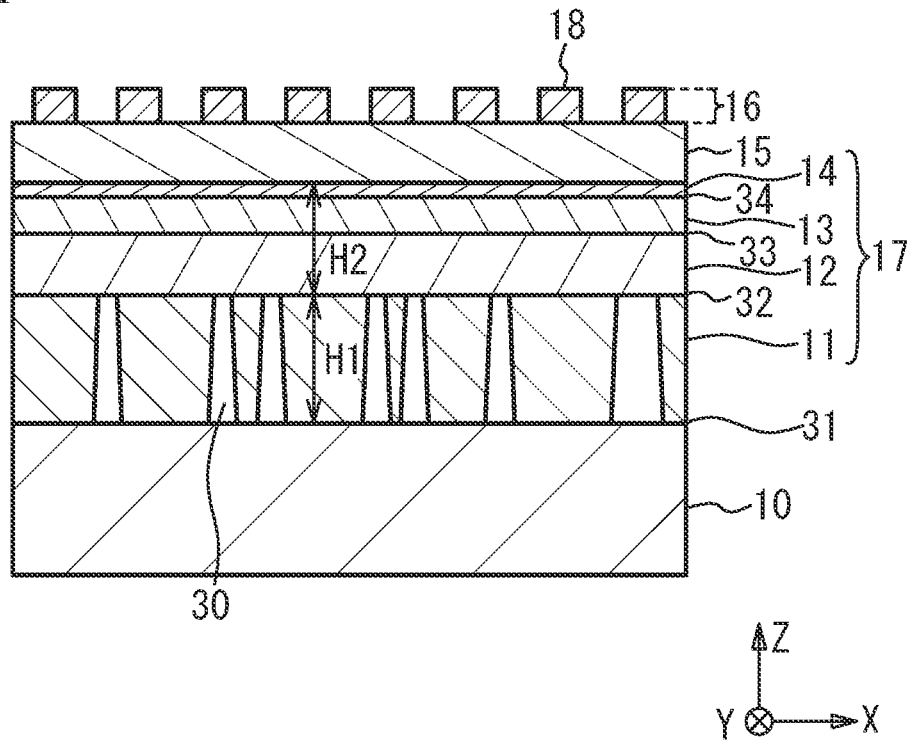
FIG. 15A and FIG. 15B are cross-sectional views of acoustic wave devices in accordance with fourth and fifth variations of the first embodiment, respectively.

FIG. 15A is a cross-sectional view of an acoustic wave device in accordance with a fourth variation of the first embodiment. As illustrated in FIG. 15A, the surface 31 of the support substrate 10 may be a flat surface. In this case, the surfaces 31 to 34 are flat surfaces. Other configurations are the same as those in the first embodiment, and a description thereof will be omitted.

Fifth Variation of the First Embodiment

Figure 15B:
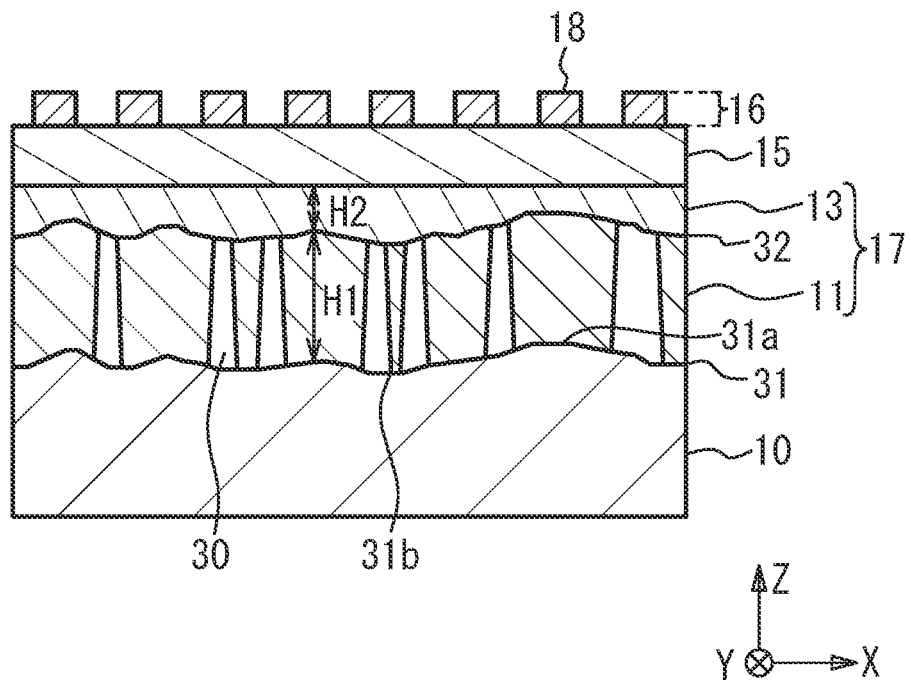

FIG. 15B is a cross-sectional view of an acoustic wave device in accordance with a fifth variation of the first embodiment. As illustrated in FIG. 15B, the insulating layers 12 and 14 are not provided. As in the fifth variation of the first embodiment, the insulating layer 17 may be one or more insulating layers. As the insulating layer 17, for example, one or a plurality of insulating layers of a silicon oxide film, a silicon nitride film, a silicon nitride oxide film, an aluminum oxide film, an aluminum nitride film, an aluminum nitride oxide film, or a silicon carbide film can be used.

In the first embodiment and the variations thereof, the insulating layer 17 is provided between the support substrate 10 and the piezoelectric layer 15. As illustrated in FIG. 2, FIG. 13, and FIG. 14, the insulating layer 17 has a plurality of the voids 30, and in each of the plurality of the voids 30 (void regions), the width in the extending direction is longer than the width in the direction orthogonal to the extending direction when viewed from the thickness direction of the support substrate 10, and the extending directions are different directions intersecting with each other. Extending directions of at least some of the plurality of the voids 30 (void regions) are different from each other, and the width in the extending direction is longer than the width in the orthogonal direction. The propagation direction of the bulk wave is not limited to the X direction in which the electrode fingers 18 are arranged. Since the extending directions of the voids 30 are different from each other, the voids 30 can attenuate bulk waves propagating in various directions and can reduce spurious emissions. The maximum value of the crossing angle at which the extending directions of two voids 30 among the plurality of the voids 30 cross each other is preferably 300 or more, and more preferably 450 or more.

A plurality of voids of which the extending directions are different from each other are connected to each other to form one void region. For example, the void 30b in FIG. 2 is formed by connecting a plurality of the voids 36a to 36d. The void 30c is formed by connecting a plurality of the voids 36e to 36i. In FIG. 13, the void 30 is formed by connecting the voids 36x to 36y. Accordingly, the void 30 and the voids 30a to 30c can further suppress bulk waves. As illustrated in FIG. 14, the voids 36x to 36z of which the extending directions are different from each other may be separated from each other.

Like the void 30b illustrated in FIG. 2, the void 30b formed by connecting a plurality of the voids 36c to 30b may have a shape in which the voids 36a to 36c extend in a plurality of directions from one point. Like the void 30c, one void 30c may have a shape in which a plurality of the voids 36e to 36i surround a part of the insulating layer 11 when viewed from the thickness direction of the support substrate 10. These configurations can further suppress the bulk waves. Further, as illustrated in FIG. 2, the insulating layer 11 may be provided with a plurality of the single voids 30d to 30f each having one extending direction in addition to the voids 30a to 30c in which a plurality of voids are connected. As described above, since the insulating layer 11 has various voids 30a to 30f having different planar shapes, it is possible to further suppress bulk waves propagating in various directions.

In the samples A1 to A3, the area of the voids 30 in a cross-sectional view is about 8% of the area of the insulating layer 11 including the voids 30. Thus, the area of the voids 30 in a cross-sectional view is preferably equal to or greater than 1% of, more preferably equal to or greater than 2% of, and further preferably equal to or greater than 5% of the area of the insulating layer 11 including the voids 30. To ensure the strength of the insulating layer 11 and attenuate the bulk wave by the surface 31, the area of the voids 30 in the cross-sectional view is preferably equal to or less than 20% of the area of the insulating layer 11 including the voids 30.

To attenuate the bulk wave, the height of the void 30 is preferably 0.2λ or greater, and more preferably 0.5λ or greater. To ensure the strength of the insulating layer 11, the height of the void 30 is preferably 10λ or less. To attenuate the bulk wave, the widths W1 and W2 of the void 30 are preferably 0.01λ or greater, and more preferably 0.1λ or greater. The widths W1 and W2 are 100 nm or greater, for example. To ensure the strength of the insulating layer 11, the widths W1 and W2 of the void 30 are preferably 2λ or less.

As in the first embodiment and the first, second, fourth, and fifth variations thereof, the interface 31 between the support substrate 10 and the insulating layer 1I is an uneven surface. Thereby, the bulk wave can be scattered by the interface, and spurious emissions can be further reduced. As in the third variation of the first embodiment, the interface between the support substrate 10 and the insulating layer 11 may be a flat surface.

To reduce spurious emissions by scattering bulk waves, in the case that the surface 31 of the support substrate 10 is a rough surface, the arithmetic average roughness Ra is preferably 100 nm or greater, and more preferably 150 nm or greater. The bulk wave is preferably not reflected by the interface between the piezoelectric layer 15 and the insulating layer 13 nor the interface between the insulating layers 12 and 13. In this respect, the arithmetic average roughness Ra of each of the surfaces 33 and 34 is preferably 10 nm or less, and more preferably 1 nm or less. In the case that the unevenness is regular as in the second variation of the first embodiment, the heights of the protrude portion 31a and the recess portion 31b are preferably 0.1λ or greater, more preferably 0.3λ or greater, and further preferably 1λ or greater. Further, the heights of the protrude portion 31a and the recess portion 31b are preferably 2λ or less. To reduce spurious emissions, the interval D1 between the protrude portions 31a or the recess portions 31b of the surface 31 is preferably 0.8λ or greater, and more preferably 1.0λ or greater. To increase the main response, the interval D1 of the surface 31 is preferably 2.4λ or less, and more preferably 1.6λ or less.

A plurality of the voids 30 overlap with the recess portions 31b of the uneven surface. Thus, as illustrated in FIG. 3B and FIG. 3C, the void 30 can be formed.

In the cross-sectional shapes of the voids 30, the width at the piezoelectric layer 15 side is narrower than the width at the support substrate 10 side. This configuration allows the voids 30 to further attenuate bulk waves.

When the upper ends of the voids 30 are close to the lower surface of the piezoelectric layer 15, the surface acoustic wave is affected by the voids 30. In this respect, the distance H2 between the void 30 and the piezoelectric layer 15 is preferably 0.5λ or greater, and more preferably 1λ or greater. The distance H2 is preferably 10λ or less.

The insulating layer 17 includes the insulating layer 11 (a first insulating layer) that is provided on the support substrate 10, has a plurality of the voids 30, and is penetrated by the voids, and the insulating layer 12 (a second insulating layer) that is provided on the insulating layer 11 and has no void 30. This structure inhibits the surface acoustic wave from being affected by the voids 30.

The insulating layer 17 includes the insulating layer 13 (a third insulating layer) that is provided on the insulating layer 12 and in which the acoustic velocity of the bulk wave is lower than the acoustic velocities of the bulk waves in the insulating layers 11 and 12. This structure can confine the surface acoustic wave in the insulating layer 13 and the piezoelectric layer 15. Therefore, the main response can be increased. By using the insulating layer 13 as a temperature compensation film, the temperature characteristics of the acoustic wave device can be improved. The acoustic velocity of the bulk wave in the insulating layer 13 is preferably equal to or less than 0.9 times the acoustic velocities of the bulk waves in the insulating layers 11 and 12, and more preferably equal to or less than 0.8 times.

As in the first variation of the first embodiment, the insulating layer 17 includes the insulating layer 12a, in which the acoustic velocity of the bulk wave is equal to or less than the acoustic velocity of the bulk wave in the insulating layer 12, between the insulating layers 11 and 12, and no void 30 is provided in the insulating layer 12a. In this manner, by providing the insulating layer 12a that inhibits the void 30 from extending to the insulating layer 12, it is possible to inhibit the main response from deteriorating due to the extension of the void 30 into the insulating layer 12.

As a method of manufacturing a wafer for the acoustic wave devices in accordance with the embodiment and the variations thereof, as illustrated in FIG. 3B, the insulating layer 11 having a plurality of first voids 30 that are in contact with the recess portions 31b of an uneven surface is formed on the support substrate 10 having the uneven surface. As illustrated in FIG. 3B, by etching parts in contact with the plurality of first voids 30 of the insulating layer 11, a plurality of second voids 30 of which extending directions are different directions intersecting with each other, and a width in the extending direction is longer than a width in a direction orthogonal to the extending direction when viewed from the thickness direction of the support substrate 10. As illustrated in FIG. 4B and FIG. 4C, the piezoelectric layer 15 is formed on the insulating layer 11. Thus, the acoustic wave devices of the first embodiment and the variations thereof can be easily manufactured.

When the acoustic wave mainly excited by a pair of the comb-shaped electrodes 20 is an SH wave, a bulk wave is easily excited. When the piezoelectric layer 15 is a 36° or more and 50° or less rotated Y-cut X-propagation lithium tantalate layer, an SH wave is excited. Therefore, in this case, it is preferable to provide the voids 30 in the insulating layer 17.

Although a surface acoustic wave (SAW) device has been mainly described as an example of the acoustic wave device, the acoustic wave device may be a bulk acoustic wave (BAW) device or a lamb wave device.

Second Embodiment

Figure 16A:
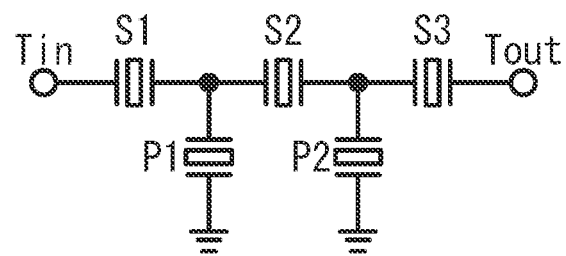
FIG. 16A is a circuit diagram of a filter in accordance with a second embodiment.

FIG. 16 a is a circuit diagram of a filter in accordance with a second embodiment. As illustrated in FIG. 16A, one or more series resonators S1 through S3 are connected in series between an input terminal Tin and an output terminal Tout. One or more parallel resonators P1 and P2 are connected in parallel between the input terminal Tin and the output terminal Tout. The acoustic wave resonator in accordance with any one of the first embodiment and the variations thereof can be used for at least one of the following resonators: one or more series resonators S1 to S3 and one or more parallel resonators P1 and P2. The number of resonators in the ladder-type filter can be set as appropriate. The filter may be a multi-mode filter having two or more pairs of comb-shaped electrodes.

First Variation of the Second Embodiment

Figure 16B:
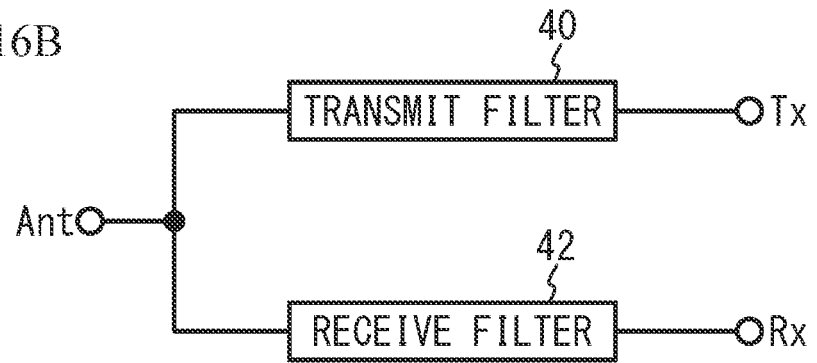
FIG. 16B is a circuit diagram of a duplexer in accordance with a first variation of the second embodiment.

FIG. 16B is a circuit diagram of a duplexer in accordance with a first variation of the second embodiment. As illustrated in FIG. 16B, a transmit filter 40 is connected between a common terminal Ant and a transmit terminal Tx. A receive filter 42 is connected between the common terminal Ant and a receive terminal Rx. The transmit filter 40 transmits signals in the transmission band to the common terminal Ant as transmission signals among high-frequency signals input from the transmit terminal Tx, and suppresses signals with other frequencies. The receive filter 42 transmits signals in the receive band to the receive terminal Rx as reception signals among high-frequency signals input from the common terminal Ant, and suppresses signals with other frequencies. The transmit filter 40, the receive filter 42, or both of them may be the filter of the second embodiment.

Although the duplexer has been described as an example of the multiplexer, the multiplexer may be a triplexer or a quadplexer.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:

1. An acoustic wave device comprising:
    a support substrate;
    a piezoelectric layer provided on the support substrate;
    at least a pair of comb-shaped electrodes provided on the piezoelectric layer, each of the comb-shaped electrodes including a plurality of electrode fingers; and
    an insulating layer provided between the support substrate and the piezoelectric layer, the insulating layer having, in at least a part thereof, a plurality of void regions of which extending directions are different from each other when viewed from a thickness direction of the support substrate, a width in the corresponding extending direction of each of the void regions being longer than a width in a direction orthogonal to the corresponding extending direction when viewed from the thickness direction of the support substrate.

2. The acoustic wave device according to claim 1, wherein the plurality of void regions of which the extending directions different from each other are connected to each other to form one void region.

3. The acoustic wave device according to claim 2, wherein the one void region has a shape in which a void region extends in a plurality of directions from one point when viewed from the thickness direction of the support substrate.

4. The acoustic wave device according to claim 2, wherein the one void region has a shape provided so as to surround a part of the insulating layer when viewed from the thickness direction of the support substrate.

5. The acoustic wave device according to claim 1, wherein an area of the plurality of void regions in a cross-sectional view is equal to or greater than 1% of an area of the insulating layer including the plurality of void regions.

6. The acoustic wave device according to claim 1, wherein an interface between the support substrate and the insulating layer is an uneven surface.

7. The acoustic wave device according to claim 6, wherein the plurality of void regions overlap a recess portion of the uneven surface.

8. The acoustic wave device according to claim 1, wherein in a cross-sectional shape of each of the plurality of void regions, a width at a side of the piezoelectric layer is narrower than a width at a side of the support substrate.

9. The acoustic wave device according to claim 1, wherein a distance between each of the plurality of void regions and the piezoelectric layer is equal to or greater than an average pitch of the plurality of electrode fingers.

10. The acoustic wave device according to claim 1, wherein the insulating layer includes a first insulating layer and a second insulating layer, the first insulating layer is provided on the support substrate, has the plurality of void regions, and is penetrated by the plurality of void regions, and the second insulating layer is provided on the first insulating layer and has no void region.

11. The acoustic wave device according to claim 10, further comprising a third insulating layer provided on the second insulating layer, the third insulating layer having an acoustic velocity lower than those of the first insulating layer and the second insulating layer.

12. A wafer comprising:
    a support substrate;
    a piezoelectric layer provided on the support substrate;
    an insulating layer provided between the support substrate and the piezoelectric layer, the insulating layer having, in at least a part thereof, a plurality of void regions of which extending directions are different from each other when viewed from a thickness direction of the support substrate, a width in the corresponding extending direction of each of the plurality of void regions being longer than a width in a direction orthogonal to the corresponding extending direction.

13. A method of manufacturing a wafer, the method comprising:
    forming, on a support substrate having an uneven surface, an insulating layer having a plurality of first void regions that are in contact with a recess portion of the uneven surface;
    forming a plurality of second void regions in the insulating layer by etching parts in contact with the plurality of first void regions of the insulating layer, extending directions of the plurality of second void regions being different from each other when viewed from a thickness direction of the support substrate, a width in the corresponding extending direction of each of the plurality of second void regions being longer than a width in a direction orthogonal to the corresponding extending direction when viewed from the thickness direction of the support substrate; and
    forming a piezoelectric layer on the insulating layer.

* * * * *